(12) United States Patent
Yun et al.

(10) Patent No.: US 7,608,534 B2
(45) Date of Patent: Oct. 27, 2009

(54) INTERCONNECTION OF THROUGH-WAFER VIAS USING BRIDGE STRUCTURES

(75) Inventors: Changhan Yun, Cambridge, MA (US);
Javier Villarreal, Cambridge, MA (US);
Maurice S. Karpman, Brookline, MA (US)

(73) Assignee: Analog Devices, Inc., Norwood, MA (US)

( * ) Notice: Subject to any disclaimer, the term of this patent is extended or adjusted under 35 U.S.C. 154(b) by 335 days.

(21) Appl. No.: 11/043,580

(22) Filed: Jan. 26, 2005

(65) Prior Publication Data

US 2006/0166480 A1 Jul. 27, 2006

Related U.S. Application Data

(60) Provisional application No. 60/576,205, filed on Jun. 2, 2004.

(51) Int. Cl.
*H10L 21/20* (2006.01)
*H10L 21/4763* (2006.01)

(52) U.S. Cl. ............... 438/618; 438/619; 438/424; 438/637

(58) Field of Classification Search ......... 438/618–619, 438/780, 424, 426, 637, 638
See application file for complete search history.

(56) References Cited

U.S. PATENT DOCUMENTS

| | | | |
|---|---|---|---|
| 4,499,655 A | 2/1985 | Anthony | 29/576 J |
| 4,921,157 A | 5/1990 | Dishon et al. | 228/124 |
| 5,089,880 A | 2/1992 | Meyer et al. | 357/75 |
| 5,229,647 A | 7/1993 | Gnadinger | 257/785 |
| 5,314,572 A | 5/1994 | Core et al. | 156/643 |
| 5,326,726 A | 7/1994 | Tsang et al. | 437/228 |
| 5,345,824 A | 9/1994 | Sherman et al. | 73/517 |
| 5,355,022 A | 10/1994 | Sugahara et al. | 257/768 |
| 5,417,111 A | 5/1995 | Sherman et al. | 73/517 |
| 5,511,428 A | 4/1996 | Goldberg et al. | 73/777 |
| 5,540,095 A | 7/1996 | Sherman et al. | 73/514.18 |
| 5,545,912 A | 8/1996 | Ristic et al. | 257/417 |
| 5,610,431 A | 3/1997 | Martin | 257/415 |
| 5,620,931 A | 4/1997 | Tsang et al. | 438/50 |

(Continued)

FOREIGN PATENT DOCUMENTS

EP 0 851 492 A2 7/1998

(Continued)

OTHER PUBLICATIONS

Ando et al., *New Packaging Technology for SAW Device*, Corporate Components Development Center, Doc. No. WA1-3, 403-406, 4 pages.

(Continued)

*Primary Examiner*—Chuong A. Luu
(74) *Attorney, Agent, or Firm*—Sunstein Kann Murphy & Timbers LLP

(57) ABSTRACT

Bridge structures provide a surface on which to form interconnections to components through through-hole vias. The bridge structures at least partially, and preferably fully, span the gap between two wafers, and, more specifically, between a through-hole via in one wafer and a corresponding component on the other wafer. Bridge structure may be formed on the wafer having the through-hole via and/or the wafer having the component.

20 Claims, 5 Drawing Sheets

U.S. PATENT DOCUMENTS

| | | | |
|---|---|---|---|
| 5,872,496 A | 2/1999 | Asada et al. | 335/78 |
| 5,929,497 A | 7/1999 | Chavan et al. | 257/417 |
| 5,939,633 A | 8/1999 | Judy | 73/514.32 |
| 6,071,389 A | 6/2000 | Zhang | 204/298.12 |
| 6,087,719 A | 7/2000 | Tsunashima | 257/686 |
| 6,118,181 A | 9/2000 | Merchant et al. | 257/757 |
| 6,153,839 A | 11/2000 | Zavracky et al. | 200/181 |
| 6,236,115 B1 | 5/2001 | Gaynes et al. | 257/774 |
| 6,239,495 B1 | 5/2001 | Sakui et al. | 257/777 |
| 6,297,072 B1 | 10/2001 | Tilmans et al. | 438/106 |
| 6,303,986 B1 | 10/2001 | Shook | 257/680 |
| 6,307,169 B1 | 10/2001 | Sun et al. | 200/181 |
| 6,323,550 B1 | 11/2001 | Martin et al. | 257/704 |
| 6,335,224 B1 | 1/2002 | Peterson et al. | 438/114 |
| 6,365,975 B1 | 4/2002 | DiStefano et al. | 257/777 |
| 6,384,353 B1 | 5/2002 | Huang et al. | 200/181 |
| 6,406,934 B1 | 6/2002 | Glenn et al. | 438/106 |
| 6,429,511 B2 | 8/2002 | Ruby et al. | 257/704 |
| 6,433,411 B1 | 8/2002 | Degani et al. | 257/678 |
| 6,436,853 B2 | 8/2002 | Lin et al. | 438/800 |
| 6,448,109 B1 | 9/2002 | Karpman | 438/108 |
| 6,448,622 B1 | 9/2002 | Franke et al. | 257/415 |
| 6,452,238 B1 | 9/2002 | Orcutt et al. | 257/415 |
| 6,504,253 B2 | 1/2003 | Mastromatteo et al. | 257/758 |
| 6,505,511 B1 | 1/2003 | Geen et al. | 73/504.12 |
| 6,512,300 B2 * | 1/2003 | Cheever et al. | 257/777 |
| 6,548,391 B1 | 4/2003 | Ramm et al. | 438/611 |
| 6,559,530 B2 | 5/2003 | Hinzel et al. | 257/684 |
| 6,577,013 B1 | 6/2003 | Glenn et al. | 257/777 |
| 6,621,168 B2 | 9/2003 | Sundahl et al. | 257/778 |
| 6,625,367 B2 | 9/2003 | Coult et al. | 385/131 |
| 6,630,725 B1 | 10/2003 | Kuo et al. | 257/659 |
| 6,633,079 B2 | 10/2003 | Cheever et al. | 257/723 |
| 6,686,642 B2 | 2/2004 | Regan et al. | 257/521 |
| 6,743,656 B2 * | 6/2004 | Orcutt et al. | 438/66 |
| 6,744,127 B2 | 6/2004 | Hedler et al. | 257/686 |
| 6,753,208 B1 | 6/2004 | MacIntyre | 438/118 |
| 6,781,239 B1 | 8/2004 | Yegnashankaran et al. | 257/777 |
| 6,791,193 B2 | 9/2004 | Watanabe et al. | 257/777 |
| 6,852,926 B2 | 2/2005 | Ma et al. | 174/52.2 |
| 6,853,067 B1 | 2/2005 | Cohn et al. | 257/704 |
| 6,906,395 B2 | 6/2005 | Smith | 257/417 |
| 6,909,146 B1 | 6/2005 | Linn et al. | 257/347 |
| 6,911,727 B1 | 6/2005 | Martin et al. | 257/704 |
| 6,933,163 B2 * | 8/2005 | Yun et al. | 438/48 |
| 6,936,918 B2 | 8/2005 | Harney et al. | 257/704 |
| 6,940,636 B2 | 9/2005 | Felton | 359/298 |
| 6,962,835 B2 | 11/2005 | Tong et al. | 438/108 |
| 6,964,882 B2 | 11/2005 | Yun et al. | 438/108 |
| 7,034,393 B2 | 4/2006 | Alie et al. | 257/704 |
| 7,275,424 B2 * | 10/2007 | Felton et al. | 73/104 |
| 7,291,561 B2 | 11/2007 | Ma et al. | 438/691 |
| 7,291,925 B2 | 11/2007 | Han et al. | 257/777 |
| 7,334,491 B2 | 2/2008 | Rudhard et al. | 73/866.1 |
| 2001/0028114 A1 | 10/2001 | Hosomi | 257/778 |
| 2002/0056925 A1 | 5/2002 | Kang et al. | 257/784 |
| 2003/0038327 A1 | 2/2003 | Smith | 257/415 |
| 2004/0016989 A1 | 1/2004 | Ma et al. | 257/528 |
| 2004/0077117 A1 * | 4/2004 | Ding et al. | 438/51 |
| 2004/0077154 A1 | 4/2004 | Nagarajan et al. | 438/455 |
| 2004/0157407 A1 | 8/2004 | Tong et al. | 438/455 |
| 2004/0219763 A1 | 11/2004 | Kim et al. | 438/455 |
| 2004/0232500 A1 | 11/2004 | Rudhard et al. | 257/414 |
| 2005/0003652 A1 | 1/2005 | Ramanathan et al. | 438/616 |
| 2005/0104187 A1 | 5/2005 | Polsky et al. | 257/690 |
| 2005/0104228 A1 | 5/2005 | Rigg et al. | 257/786 |
| 2005/0170609 A1 * | 8/2005 | Alie et al. | 438/455 |
| 2005/0186705 A1 | 8/2005 | Jackson et al. | 438/106 |
| 2005/0269678 A1 | 12/2005 | Martin et al. | 257/680 |
| 2006/0043569 A1 | 3/2006 | Benson et al. | 257/698 |
| 2006/0046475 A1 | 3/2006 | Wark et al. | 438/667 |
| 2006/0118946 A1 | 6/2006 | Alie et al. | 257/704 |
| 2007/0069391 A1 | 3/2007 | Gritti | 257/777 |

FOREIGN PATENT DOCUMENTS

| | | |
|---|---|---|
| EP | 1 219 565 A1 | 7/2002 |
| EP | 1 296 374 A1 | 3/2003 |
| JP | 2006 186179 A | 7/2006 |
| WO | WO 96/13062 | 5/1996 |
| WO | WO 01/56921 A2 | 8/2001 |
| WO | WO 02/093122 A2 | 11/2002 |
| WO | WO 2005/058749 A1 | 6/2005 |

OTHER PUBLICATIONS

Boustedt et al., *Flip Chip as an Enabler for MEMS Packaging*, 2002 Electronic Components and Technology Conference, Apr. 2002, 124-128, 5 pages.

Ok et al., *High Density, High Aspect Ratio Through-Wafer Electrical Interconnect Vias for MEMS Packaging*, 2003 IEEE Transactions on Advanced Packaging, vol. 26, No. 3, Doc. No. 1521-3323, Aug. 2003, 302-309, 8 pages.

Ok et al., *Generic, Direct-Chip-Attach MEMS Packaging Design with High Density and Aspect Ratio through-Wafer Electrical Interconnect*, 2002 Electronic Components and Technology Conference, Apr. 2002, 232-237, 6 pages.

Park et al., *A Novel-Low-Loss Wafer-Level Packaging of the RF-MEMS Devices*, 2002 IEEE, Doc. No. 0-7803-7185, Feb. 2002, 681-684, 4 pages.

Premachandran et al., *A Novel Electrically Conductive Wafer Through Hole Fille Vias Interconnect for 3D MEMS Packaging*, May 2003, 627-630, 4 pages.

Seeger et al., *Fabrication challenges for next-generation devices: Microelectromechanical systems for radio-frequency wireless communications*, 2003 Society of Photo-Optical Instrumentation Engineers, Jul. 2003, 169-177, 9 pages.

ShellBGA, Online <www.shellcase.com/pages/products-shellbga.asp>, Dec. 2, 2002, 2 pages.

Teomim et al., *An innovative approach to wafer-level MEMS packaging*, Solid State Technology-semiconductor manufacturing and wafer fabrication, Dec. 2, 2002, 1-4, 4 pages.

Ziptronix White Paper, *MEMS: Mainstream Process Integration*, Ziptronix, 7 pages.

Cheng, C., et al., "An Efficient Electrical Addressing Method Using Through-Wafer Vias for Two-Dimensional Ultrasonic Arrays," *IEEE Ultrasonics Symposium*, 2000, pp. 1179-1182.

Mitsuo Umemoto et al., "*High Performance Vertical Interconnection for High-Density 3D Chip Stacking Package*," IEEE 2004 Electronic Components and Technology Conference, pp. 616-623.

Calmes, S., et al., "High Integrated 2-D Capacitive Micromachined Ultrasonic Transducers," *IEEE Ultrasonics Symposium*, 1999, pp. 1163-1166.

Naotaka Tanaka et al., "*Mechanical Effects of Copper Through-Vias in a 3D Die-Stacked Module*," IEEE 2002 Electronic Components and Technology Conference, pp. 473-479.

A.R. Mirza, Ph.D., "*One Micron Precision, Wafer-Level Aligned Bonding for Interconnect, MEMS and Packaging Applications*," IEEE 2000 Electronic Components and Technology Conference, pp. 676-680.

Guoqiang Feng et al., "*Through Wafer Via Technology for 3-D Packaging*," 2005 IEEE, 2005 6th International Conference on Electronic Packaging Technology, 4 pages.

Chavan et al., *A Monolithic Fully-Integrated Vacuum-Sealed CMOS Pressure Sensor*, 2000 IEEE, Doc. No. 0-7803-5273-4/00, pp. 341-346.

Y. Tomita et al., *Advanced Packaging Technologies on 3D Stacked LSI Utilizing the Micro Interconnections and the Layered Microthin Encapsulation*, IEEE, May 29, 2001, pp. 347-355.

Authorized Officer Götz, A., *International Search Report and the Written Opinion of the International Searching Authority*, PCT/US2005/012939, Sep. 7, 2005, 12 pages.

Authorized Officer Guido Ploner, *International Search Report and the Written Opinion of the International Searching Authority*, PCT/US2007/080045, Dec. 6, 2007, 13 pages.

Authorized Officer Mattias Ahlstedt, *International Search Report and the Written Opinion of the International Searching Authority*, PCT/US2006/003673, Oct. 9, 2006, 20 pages.

Authorized Officer Götz. A, *International Search Report*, International Searching Authority, International Application No. PCT/US2004/041549, Mar. 14, 2005, 7 pages.

Wolffenbuttel, *Low-Temperature Intermediate Au-Si Wafer Bonding; Eutectic or Silicide Bond*, Sensors and Actuators A 62 (1997) pp. 680-686.

Patent Office of the People's Republic of China, Notification of the First Office Action, Appl. No. 200510007914.1, Applicant: Analog Devices, Inc. Nov. 2, 2007.

U.S. Office Action dated Nov. 7, 2006, U.S. Appl. No. 11/248,006, filed Oct. 11, 2005, 11 pages.

U.S. Office Action dated Dec. 27, 2006, U.S. Appl. No. 11/043,580, filed Jan. 26, 2005, 10 pages.

Analia Iperione, Authorized Officer Invitation to Pay Additional Fees and, Where Applicable, Protest Fee; PCT/US2008/050941.

Philippe Foussier, Authorized Officer International Search Report and Written Opinion, PCT/U52008/050941, dated Nov. 3, 2008.

Database WPI, Thomson Scientific, London, GB, AN 2006-541950 XP002501240 English abstract may be related to Japanese published application 2006 186179 A.

K. Boustedt et al. *"Flip Chip as an Enabler for MEMS Packaging,"* IEEE 2002 Electronic Components and Technology Conference, pp. 124-128.

Martin, Wafer Capping of MEMS with Fab-Friendly Metals, Analog Devices Inc., MicroMachined Products Division, SPIE presentation, Jan. 19, 2007.

Karimy, M., Examiner U.S. Office Action, dated Dec. 2, 2008, filed Feb. 3, 2005, Application No. 11/050,469.

\* cited by examiner

INTERCONNECTION OF THROUGH-WAFER VIAS USING BRIDGE STRUCTURES

This application claims priority from U.S. Provisional Patent Application No. 60/576,205 entitled CAPPED PACKAGE WITH CONDUCTIVE PATH THROUGH CAP AND METHOD OF PRODUCING THE SAME, filed on Jun. 2, 2004 in the name of Maurice S. Karpman.

FIELD OF THE INVENTION

The present invention relates generally to fabrication of capped or stacked wafer devices, and, more particularly, to interconnection of through-wafer vias using bridge structures.

BACKGROUND OF THE INVENTION

Wafer devices, such as MEMS devices and IC devices, may include two or more wafers that are bonded to one another. Either or both of the wafers may include micromachined and/or integrated circuit components that are formed through various processes. For convenience, one of the wafers is referred to hereinafter as the device wafer, while the other of the wafers is referred to hereinafter as the cap wafer.

It is often necessary or desirable to provide connections to components through one or both of the wafers. For example, it may be necessary or desirable to provide electrical connections through the cap wafer to electrical components on the device wafer. Therefore, holes (often referred to as "through-hole vias") can be formed through the cap wafer in order to expose components on the device wafer. Interconnections can be formed through the through-hole vias to the components, for example, using a material deposition process, in order to allow connectivity from the top side of the cap wafer through to the components on the device wafer.

One problem with such wafer devices is that there can be gaps between the cap wafer and the device wafer when the cap wafer and the device wafer are bonded together. The gaps can be caused by the thickness of a bonding material, uneven topography of the wafer surfaces, and/or the inherent space between adjacent (unbonded) materials. The size of the gaps can be different at different locations along the surfaces of the wafers.

When there is a significant gap between the bottom of a through-hole via and a corresponding component on the device wafer, it can be difficult to form an interconnection through the through-hole via to the component. For example, in a typical material deposition process used to form interconnections (e.g., electrodes), the interconnection is "grown" by building up layers of material. Generally speaking, the material requires a surface on which to grow. Thus, the material will generally adhere to and grow on the inside surface of the through-hole via, on the surface of the component, and on the successively deposited layers of material. Depending on the size of the gap between the through-hole via and the corresponding component, it could take a great deal of time to grow the interconnection. For example, the gap between the cap wafer and the device wafer could be on the order of several microns, and it could literally take many days to grow an interconnection across such a gap using typical deposition techniques. This is expensive in terms of time and production costs.

FIGS. 1A-1C demonstrate interconnection of through-wafer vias as known in the art. FIG. 1A shows a cross-sectional view of a capped wafer device including a cap wafer 102 having pre-formed vias 104, cavity 108, and bonding materials 106 and a device wafer 110 having a MEMS device 114 (such as an optical mirror, inertial sensor, comb fingers, or other device) and bond pads 112. FIG. 1B shows the gap 116 that remains when the cap wafer 102 and the device wafer 110 are bonded to one another. FIG. 1C shows interconnections 118 that are formed through the through-hole vias 104 to the components 112 across the gap 116.

SUMMARY OF THE INVENTION

Embodiments of the present invention use a bridge structure to at least partially, and preferably fully, span the gap between the two wafers, and, more specifically, between a through-hole via in one wafer and a corresponding component on the other wafer. The bridge structure provides a surface on which to form an interconnection. In this way, the interconnection does not have to be built up across the entire gap between the wafers, thereby reducing production time and cost.

In accordance with one aspect of the invention there is provided a method for forming an interconnection in a capped or stacked wafer device. The method involves forming a bridge structure on a first wafer device, bonding the first wafer device to a second wafer device such that the bridge structure at least partially spans a gap between a through-hole via in one of the wafers and a corresponding component on the other wafer, and forming an interconnection to the component through the through-hole via across the bridge structure.

The bridge structure may be formed on the wafer having the through-hole via or the wafer having the component. The bridge structure may span the entire gap between the wafers or only a portion of the gap. The bridge structure preferably forms a contiguous surface between the through-hole via and the component on which to form the interconnection. The bridge structure preferably juts out into a path between the through-hole via and the component. The component may be a bond pad.

The bridge structure may be formed in a variety of ways. For example, the bridge structure may be formed by depositing the bridge structure on the first wafer. Alternatively, the bridge structure may be formed by depositing a bridge structure material layer on the first wafer and etching the bridge structure from the bridge structure material layer. In this latter approach, if the first wafer includes the through-hole via, the method may also involve exposing the through-hole via through the bridge structure material layer.

The interconnection may be formed by depositing an interconnection material through the through-hole via onto the component and the bridge structure, for example, by sputtering.

The bridge structure may be removed after the interconnection is formed.

In accordance with another aspect of the invention there is provided an apparatus including a first wafer device having a bridge structure formed thereon, a second wafer device bonded to the first wafer device such that the bridge structure at least partially spans a gap between a through-hole via in one of the wafers and a corresponding component on the other wafer, and an interconnection formed through the through-hole via to the component across the bridge structure.

The first wafer device may include the through-hole via or may include the component. The bridge structure preferably spans the entire gap between the wafers. The bridge structure preferably forms a contiguous surface between the through-hole via and the component on which the interconnection is formed. The component may be a bond pad.

DETAILED DESCRIPTION OF A PREFERRED EMBODIMENT

In embodiments of the present invention, one or more bridge structures are formed between two wafers in a capped or stacked wafer device so as to at least partially, and preferably fully, span the gap between the two wafers. Preferably, the bridge structures are formed between the bottom of a through-hole via on one wafer (i.e., referred to as the cap wafer) and a corresponding component on the other wafer (i.e., referred to as the device wafer) so as to partially or fully span the gap between the bottom of the through-hole via and the component. Each bridge structure provides a surface on which an interconnection can be formed, for example, using a material deposition process. By providing a surface that partially or fully spans the gap between the bottom of the through-hole via and the component, the interconnection does not have to be built up across the entire gap between the wafers, thereby reducing production time and cost. The bridges are particularly useful for forming electrical interconnections to components (such as electrical bond pads) on the device wafer, although the present invention is not limited to forming electrical interconnections.

Figure 1A:
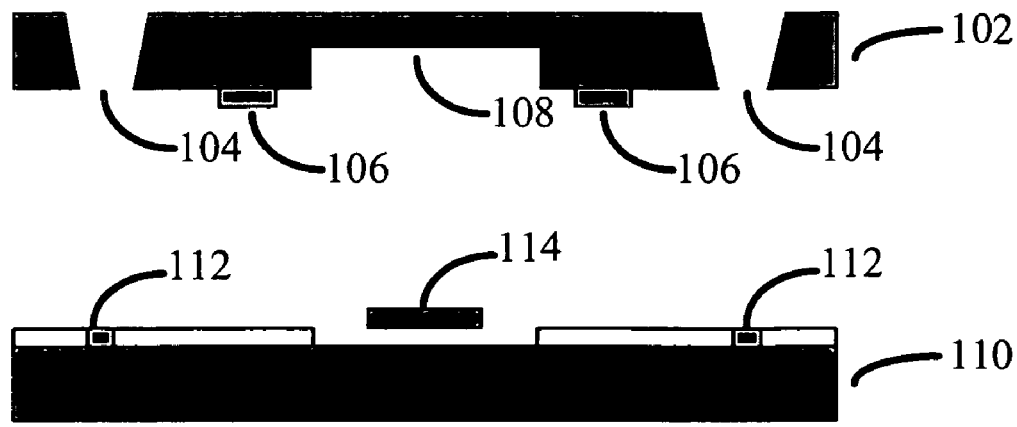
FIGS. 1A-1C demonstrate interconnection of through-wafer vias as known in the art.
Figure 1B:
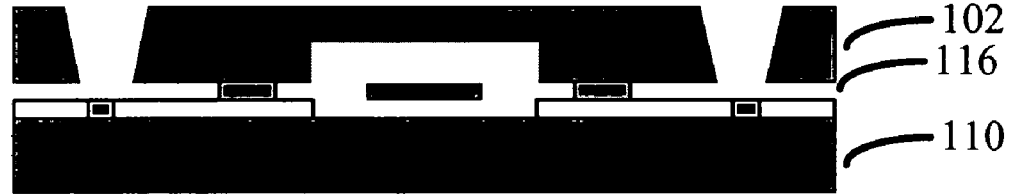
Figure 1C:
Figure 2A:
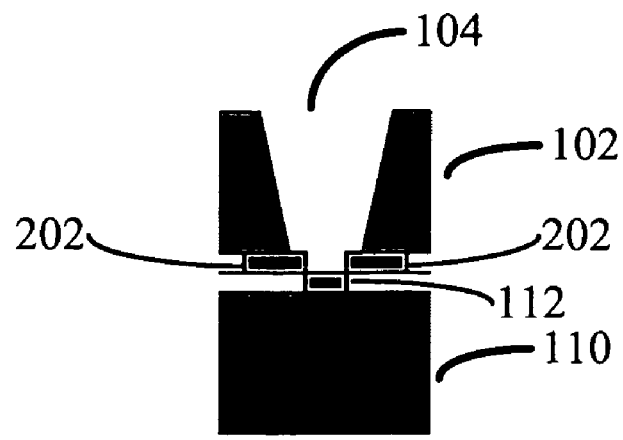
FIGS. 2A-2B demonstrate interconnection of through-wafer vias in accordance with an embodiment of the present invention.
Figure 2B:
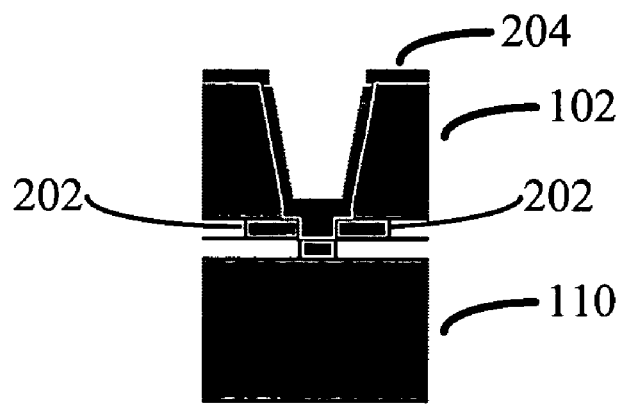

FIGS. 2A-2B demonstrate interconnection of through-wafer vias in accordance with an embodiment of the present invention. FIG. 2A shows a cross-sectional view of a capped or stacked wafer device in which one or more bridge structures 202 are formed between the through-hole via 104 in the cap wafer 102 and the component 112 on the device wafer 110. The bridge structures 202 can be formed on either the cap wafer 102 or the device wafer 110. The bridge structures 202 are typically formed from a compliant material that allows for formation of the interconnection. The bridge structures 202 preferably jut out into the path between the through-hole via 104 and the component 112 in order to provide a contiguous exposed surface on which to grow an interconnection. FIG. 2B shows an interconnection 204 that is formed through the through-hole via 104 to the component 112 across the bridge structures 202. Because the interconnection 204 does not need to be built up across the entire gap, production time and cost can be significantly reduced. After the interconnections have been formed across the bridge structures, the bridge structures could be removed if necessary or desirable for a particular application.

Although the bridge structures can be formed on either the cap wafer or the device wafer, it is typical for the bridge structures to be formed on the cap wafer. In some embodiments of the present invention, the bridge structures may be formed from the same material as the bonding material (e.g., a glass frit material), in which case the bridge structures may be formed at the same time the bonding material is formed. In some embodiments of the present invention, the bridge structures can serve as the bonding material and therefore separate bonding structures may be optional. The bridge structures can be formed using any of a variety of materials and techniques, and the present invention is not limited to any particular materials or techniques. Two exemplary techniques for forming bridge structures are described below.

Figure 3A:
FIGS. 3A-3E demonstrate a first technique for forming bridge structures in which the bridge structures are deposited on the cap wafer, in accordance with an embodiment of the present invention.
Figure 3B:
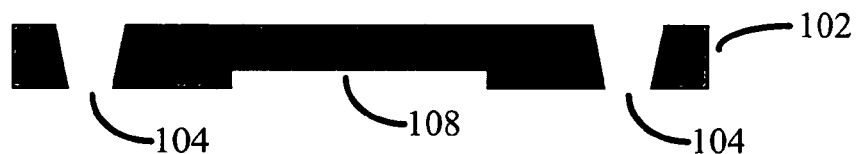
Figure 3C:
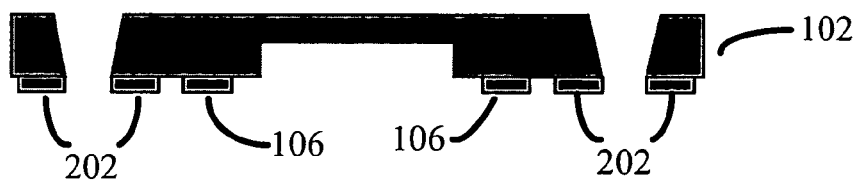
Figure 3D:
Figure 3E:

FIGS. 3A-3E demonstrate a first technique for forming bridge structures in which the bridge structures are deposited on the cap wafer, in accordance with an embodiment of the present invention. FIG. 3A shows an essentially blank cap wafer 102. FIG. 3B shows the cap wafer 102 after formation of through-hole vias 104 and cavity 108. FIG. 3C shows the cap wafer 102 after formation of bonding materials 106 and bridge structures 202. It should be noted that the bonding materials 106 and bridge structures 202 can be fabricated from the same material or different materials and using the same process or different processes. FIG. 3D shows the cap wafer 102 bonded to a device wafer 110, with the bridge structures 202 spanning the gap between the through-hole vias 104 and components on the device wafer 110. FIG. 3E shows interconnections 204 that are formed through the through-hole vias to the components across the bridge structures.

It should be noted that, in FIG. 3C, the bridge structures 202 may be fabricated to the edge of the through-hole vias rather than jutting out past the edge of the through-hole vias. When the cap wafer 102 and the device wafer 110 are bonded to one another, the bridge structures 202 may be compressed and therefore expand so as to jut out past the edge of the through-hole vias. Thus, in FIG. 3D, the bridge structures 202 jut out into the path between the through-hole vias and the components in order to provide contiguous exposed surfaces on which to grow interconnections.

Figure 4A:
FIGS. 4A-4F demonstrate a second technique for forming bridge structures in which the bridge structures are etched on the cap wafer, in accordance with an embodiment of the present invention.
Figure 4B:
Figure 4C:
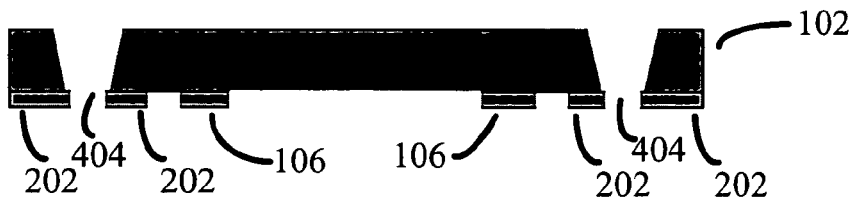
Figure 4D:
Figure 4E:
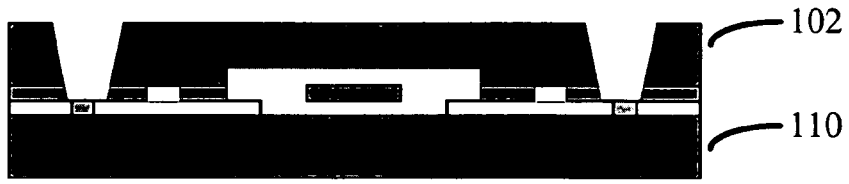
Figure 4F:
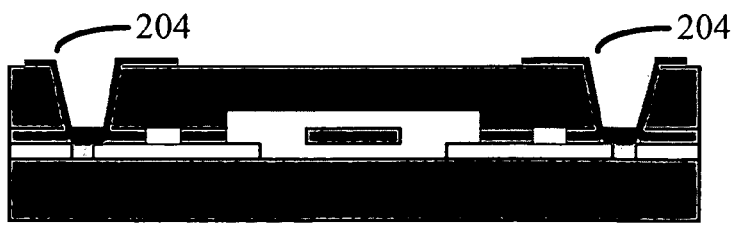

FIGS. 4A-4F demonstrate a second technique for forming bridge structures in which the bridge structures are etched on the cap wafer, in accordance with an embodiment of the present invention. FIG. 4A shows a cap wafer 102 having a deposited bonding/bridge material layer 402. FIG. 4B shows the cap wafer 102 after formation of through-hole vias 104. FIG. 4C shows the cap wafer 102 after etching of the bonding/bridge material layer to expose the through-hole vias 104 and form the bonding materials 106 and bridge structures 202. FIG. 4D shows the cap wafer 102 after forming cavity 108. FIG. 4E shows the cap wafer 102 bonded to a device wafer 110, with the bridge structures 202 spanning the gap between the through-hole vias 104 and components on the device wafer 110. FIG. 4F shows interconnections 204 that are formed through the through-hole vias to the components across the bridge structures.

It should be noted that, in FIG. 4C, the bridge structures 202 may be fabricated beyond the edge of the through-hole vias so as to jut out past the edge of the through-hole vias. Thus, in FIG. 4E, the bridge structures 202 jut out into the path between the through-hole vias and the components in order to provide contiguous exposed surfaces on which to grow interconnections.

Figure 5A:
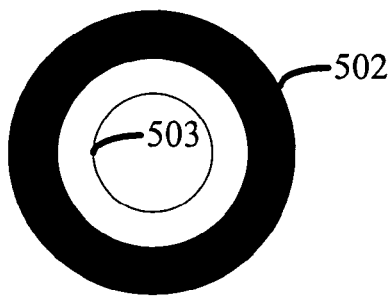
FIGS. 5A-5D demonstrate some exemplary bridge structure configurations in accordance with embodiments of the present invention.
Figure 5B:
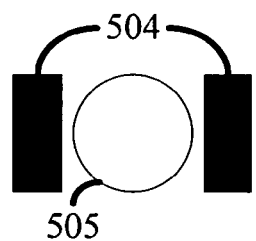
Figure 5C:
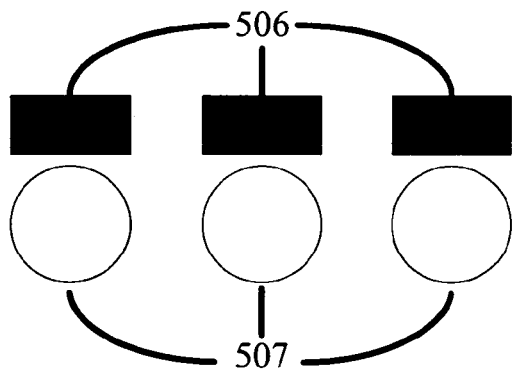

FIGS. 5A-5D demonstrate some exemplary bridge structure configurations in accordance with embodiments of the present invention. FIG. 5A shows a ring-shaped bridge structure 502 surrounding the through-hole via (represented by the inner circle 503). FIG. 5B shows two rectangular-shaped bridge structures 504 flanking a through-hole via 505. FIG.

Figure 5D:
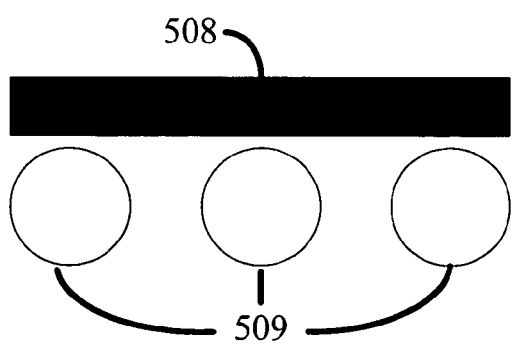

5C shows multiple bridge structure 506 adjacent to multiple through-hole vias 507. FIG. 5D shows a single elongated bridge structure 508 adjacent to multiple through-hole vias 509. The present invention is in no way limited to these or to any particular bridge structure shapes or configurations.

The bridge structures can be formed on the cap wafer and/or the device wafer using any of a variety of techniques, and the present invention is not limited to any particular technique or techniques for forming the bridge structures. For example, bridge structures can be formed using a material deposition process, such as screen printing, shadow masking, physical vapor deposition (e.g., evaporation or sputtering), or chemical vapor deposition, to name but a few.

Furthermore, the interconnections can be formed through the through-hole via using any of a variety of techniques, and the present invention is not limited to any particular technique or techniques for forming the interconnections. For example, interconnections can be formed using a material deposition process, such as screen printing, shadow masking, physical vapor deposition (e.g., evaporation or sputtering), or chemical vapor deposition, to name but a few.

While the bridge structures are generally shown to contact the components on the device wafer, the bridge structures are not required to contact the components on the device wafer, although it is preferable that the bridge structures at least abut the components. In situations where the bridge structures do not abut or otherwise contact the components, any surface material between the edge of the bridge structures and the components should allow for formation of the interconnections.

While the through-hole vias are shown with circular openings and sloped sides, the present invention is in no way limited to the shape of the through-hole vias. For example, the through-hole vias could have square openings, and the sides of the through-hole vias could be sloped or unsloped.

The through-hole vias are typically fabricated by etching, although the through-hole vias can be formed in other ways, and the present invention is not limited to any particular way of forming the through-hole vias.

The cap wafer and/or the device wafer can be based on any of a variety of substrates, including, but in no way limited to, silicon, polysilicon, glass, ceramic, or metal substrates, to name but a few. If the cap wafer is made from an electrically conductive material (e.g., silicon, which is semiconducting, or metal, which is conducting), then the through-hole vias must typically be coated or lined with an insulating material (e.g., an oxide or other insulating material) before an electrical interconnection is formed through the through-hole via. For convenience, such coated or lined through-hole vias are not shown in the drawings.

In embodiments of the present invention described above, the cap wafer includes a cavity to fit around a corresponding structure on the device wafer. This cavity should be considered an optional feature and may not be required in all embodiments. Therefore, the present invention does not require formation of a cavity in the cap wafer.

The order in which various process steps are demonstrated in the drawings should be construed to limit the present invention to any particular process flow or implementation. Various process steps could be performed in different orders without changing the overall results or otherwise departing from the true scope of the invention. For example, the process steps shown in FIGS. 4B, 4C, and 4D could be done in different orders.

The present invention may be embodied in other specific forms without departing from the true scope of the invention. The described embodiments are to be considered in all respects only as illustrative and not restrictive.

What is claimed is:

1. A method for forming an interconnection in a capped or stacked wafer device, the method comprising:
    forming a bridge structure on a first wafer device;
    bonding the first wafer device to a second wafer device such that the bridge structure at least partially spans a gap between a through-hole via in one of the wafers and a corresponding component on the other wafer; and
    forming an interconnection to the component through the through-hole via across the bridge structure.

2. A method according to claim 1, wherein the bridge structure is formed on the wafer having the through-hole via.

3. A method according to claim 1, wherein the bridge structure is formed on the wafer having the component.

4. A method according to claim 1, wherein the bridge structure spans the entire gap between the wafers.

5. A method according to claim 1, wherein the bridge structure forms a contiguous surface between the through-hole via and the component on which to form the interconnection.

6. A method according to claim 1, wherein the bridge structure juts out into a path between the through-hole via and the component.

7. A method according to claim 1, wherein forming the bridge structure comprises:
    forming the bridge structure on the first wafer using a material deposition process.

8. A method according to claim 1, wherein forming the bridge structure comprises:
    depositing a bridge structure material layer on the first wafer; and
    etching the bridge structure from the bridge structure material layer.

9. A method according to claim 8, wherein the first wafer includes the through-hole via, and wherein the method further comprises:
    exposing the through-hole via through the bridge structure material layer.

10. A method according to claim 1, wherein forming the interconnection comprises:
    depositing an interconnection material through the through-hole via onto the component and the bridge structure.

11. A method according to claim 10, wherein the interconnection material is deposited by a physical or chemical vapor deposition process.

12. A method according to claim 1, further comprising:
    removing the bridge structure after forming the interconnection.

13. A method according to claim 1, wherein the component is a bond pad.

14. A method according to claim 1, wherein the bridge structure is formed from a material used to bond the wafers.

15. Apparatus comprising:
    a first wafer having a component;
    a second wafer bonded to the first wafer, the second wafer having a through-hole via;
    at least one bridge structure formed on one of the wafers, wherein the bridge structure at least partially spans a gap between the through-hole via and the component; and
    an interconnection formed through the through-hole via to the component across the bridge structure.

16. Apparatus according to claim 15, wherein the at least one bridge structure spans the entire gap between the wafers.

17. Apparatus according to claim 15, wherein the at least one bridge structure forms a contiguous surface between the through-hole via and the component on which the interconnection is formed.

18. Apparatus according to claim 15, wherein a bridge structure is formed on at least one of the first wafer and the second wafer.

19. Apparatus according to claim 15, wherein the at least one bridge structure is formed from a material used to bond the wafers.

20. Apparatus according to claim 15, wherein the at least one bridge structure juts out into a path between the through-hole via and the component.

* * * * *

UNITED STATES PATENT AND TRADEMARK OFFICE
CERTIFICATE OF CORRECTION

PATENT NO. : 7,608,534 B2 Page 1 of 1
APPLICATION NO. : 11/043580
DATED : October 27, 2009
INVENTOR(S) : Yun et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 294 days.

Signed and Sealed this

Twelfth Day of October, 2010

David J. Kappos
*Director of the United States Patent and Trademark Office*